(12) United States Patent
Su et al.

(10) Patent No.: US 9,972,630 B2
(45) Date of Patent: May 15, 2018

(54) SPLIT GATE NON-VOLATILE FLASH MEMORY CELL HAVING METAL GATES AND METHOD OF MAKING SAME

(71) Applicant: Silicon Storage Technology, Inc., San Jose, CA (US)

(72) Inventors: Chien-Sheng Su, Saratoga, CA (US); Feng Zhou, Fremont, CA (US); Jeng-Wei Yang, Zhubei (TW); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days. days.

(21) Appl. No.: 15/295,022

(22) Filed: Oct. 17, 2016

(65) Prior Publication Data

US 2017/0125429 A1 May 4, 2017

Related U.S. Application Data

(60) Provisional application No. 62/250,349, filed on Nov. 3, 2015.

(51) Int. Cl.
*H01L 21/336* (2006.01)
*H01L 27/11521* (2017.01)
*H01L 21/28* (2006.01)
*H01L 29/423* (2006.01)
*H01L 29/66* (2006.01)
(Continued)

(52) U.S. Cl.
CPC .. *H01L 27/11521* (2013.01); *H01L 21/28273* (2013.01); *H01L 27/11524* (2013.01); *H01L 29/42328* (2013.01); *H01L 29/66825* (2013.01); *H01L 29/788* (2013.01); *H01L 29/7881* (2013.01)

(58) Field of Classification Search
CPC .................................................. H01L 29/42344
USPC .................................................. 438/267, 596
See application file for complete search history.

(56) References Cited

U.S. PATENT DOCUMENTS 6,747,310 B2  6/2004 Fan et al.
7,368,354 B2  5/2008 Anderson et al.
(Continued)

FOREIGN PATENT DOCUMENTS

TW    200614334 A    5/2006
TW    201511238 A    3/2015

*Primary Examiner* — Chandra Chaudhari

(74) *Attorney, Agent, or Firm* — DLA Piper LLP (US)

(57) ABSTRACT

A memory device including a silicon substrate having a planar upper surface in a memory cell area and an upwardly extending silicon fin in a logic device area. The silicon fin includes side surfaces extending up and terminating at a top surface. The logic device includes spaced apart source and drain regions with a channel region extending there between (along the top surface and the side surfaces), and a conductive logic gate disposed over the top surface and laterally adjacent to the side surfaces. The memory cell includes spaced apart source and drain regions with a second channel region extending there between, a conductive floating gate disposed over one portion of the second channel region, a conductive word line gate disposed over another portion of the second channel region, a conductive control gate disposed over the floating gate, and a conductive erase gate disposed over the source region.

10 Claims, 31 Drawing Sheets

(51) Int. Cl.
  *H01L 29/788* (2006.01)
  *H01L 27/11524* (2017.01)

(56) References Cited

U.S. PATENT DOCUMENTS

| | | |
|---|---|---|
| 7,410,913 B2 | 8/2008 | Lee et al. |
| 7,423,310 B2 | 9/2008 | Verhoeven |
| 7,868,375 B2 | 1/2011 | Liu et al. |
| 8,461,640 B2 | 6/2013 | Hu et al. |
| 8,883,592 B2 | 11/2014 | Kotov et al. |
| 8,951,864 B2 * | 2/2015 | Wang ................ H01L 21/28273 438/267 |
| 9,123,822 B2 | 9/2015 | Yoo et al. |
| 9,252,246 B2 | 2/2016 | Perera et al. |
| 9,263,132 B2 * | 2/2016 | Tan ................ H01L 21/28273 |
| 9,406,689 B2 | 8/2016 | Li et al. |
| 2016/0276357 A1 | 9/2016 | Su et al. |

* cited by examiner

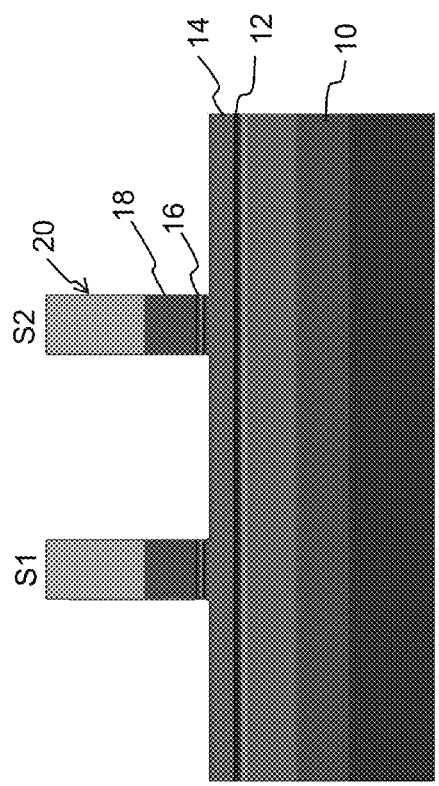
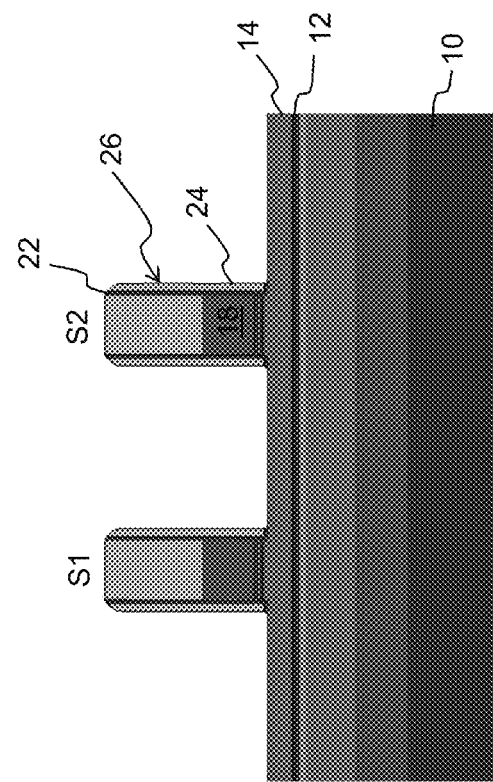

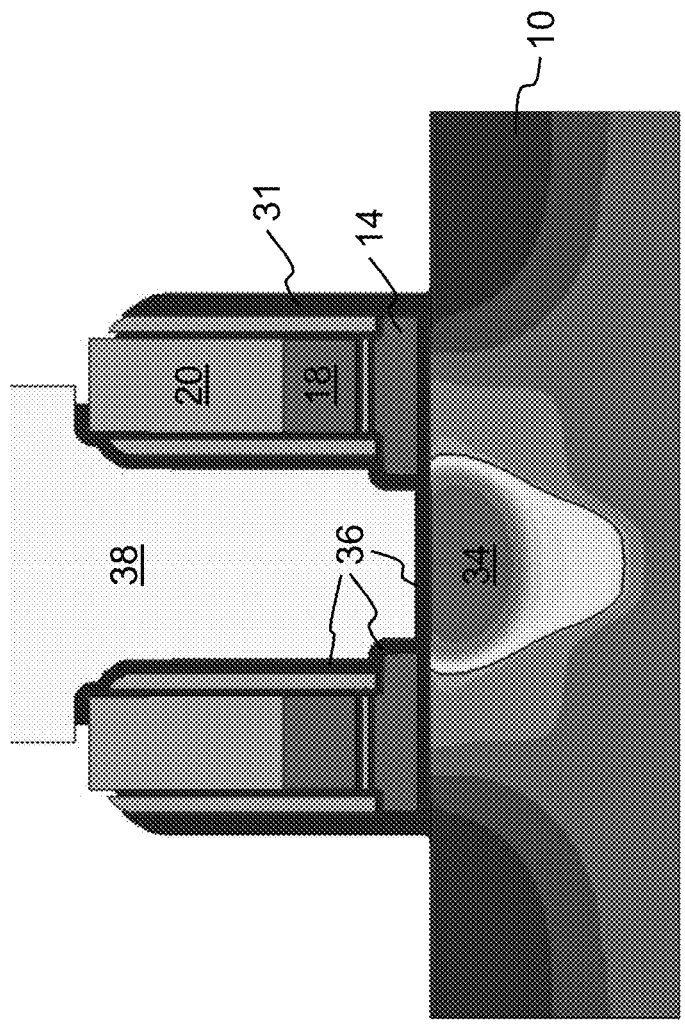

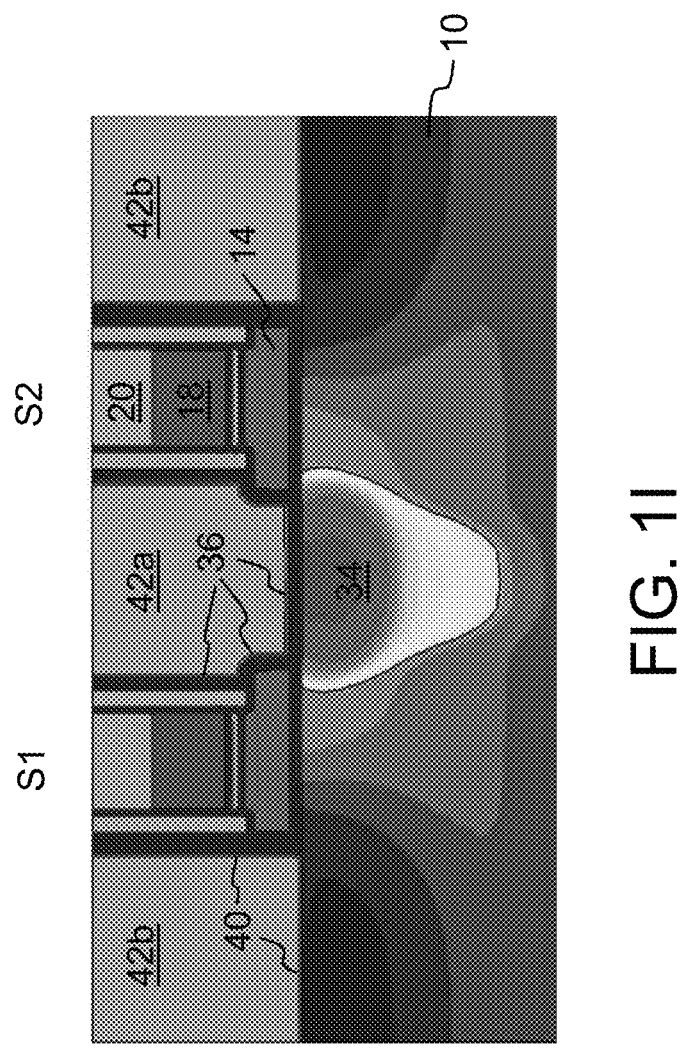

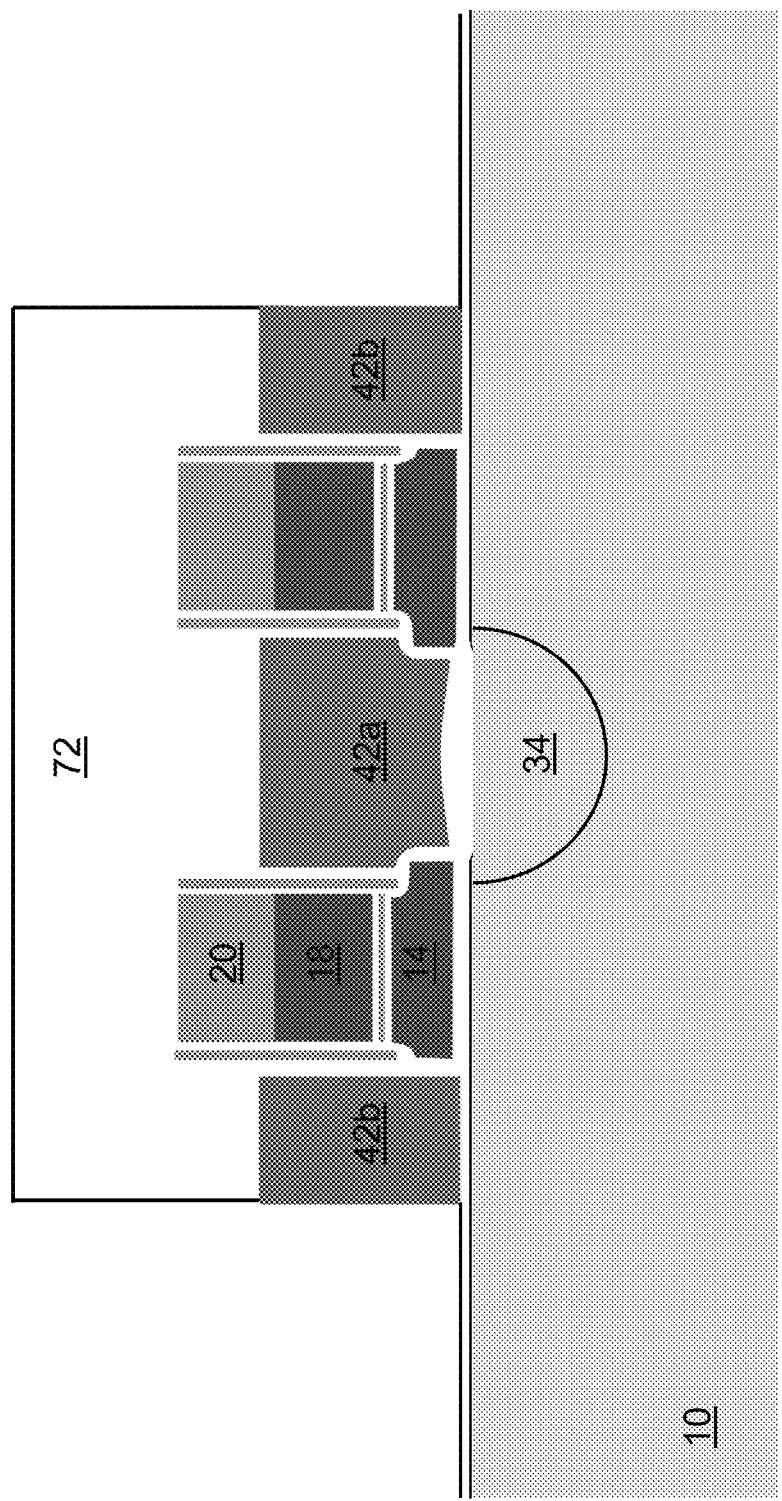

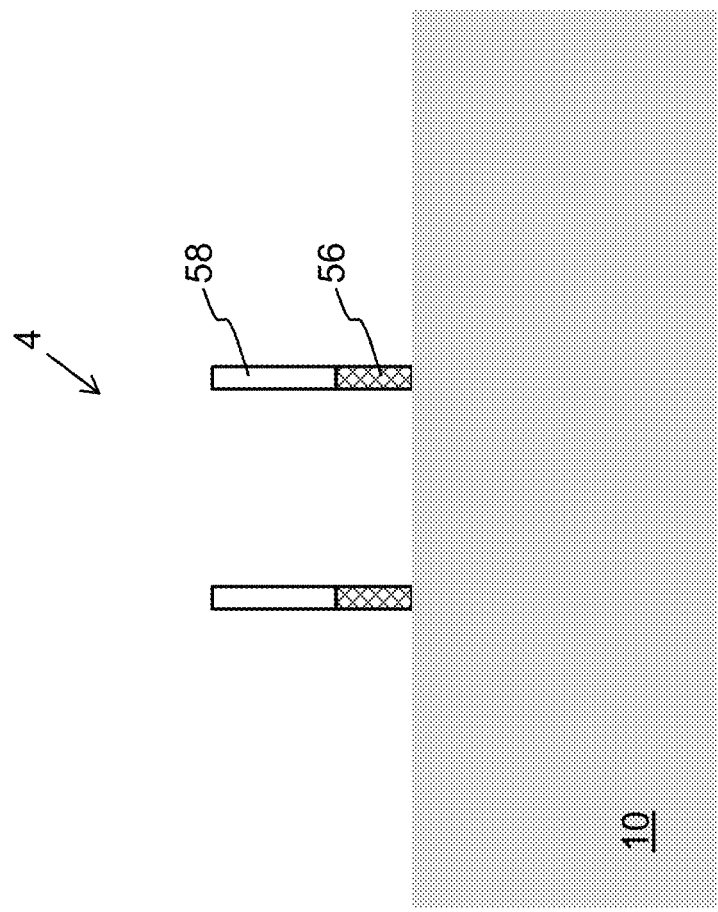

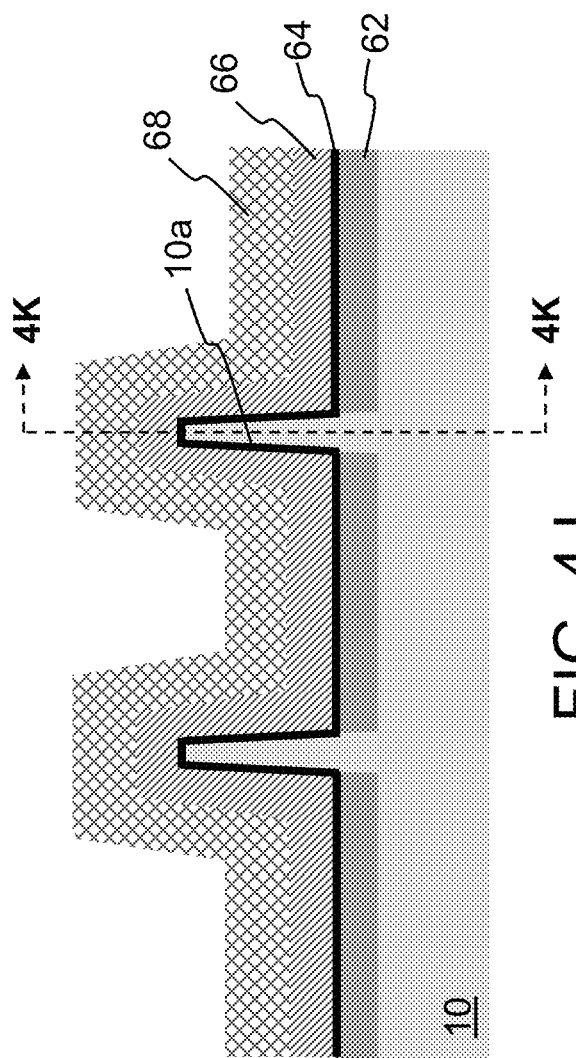

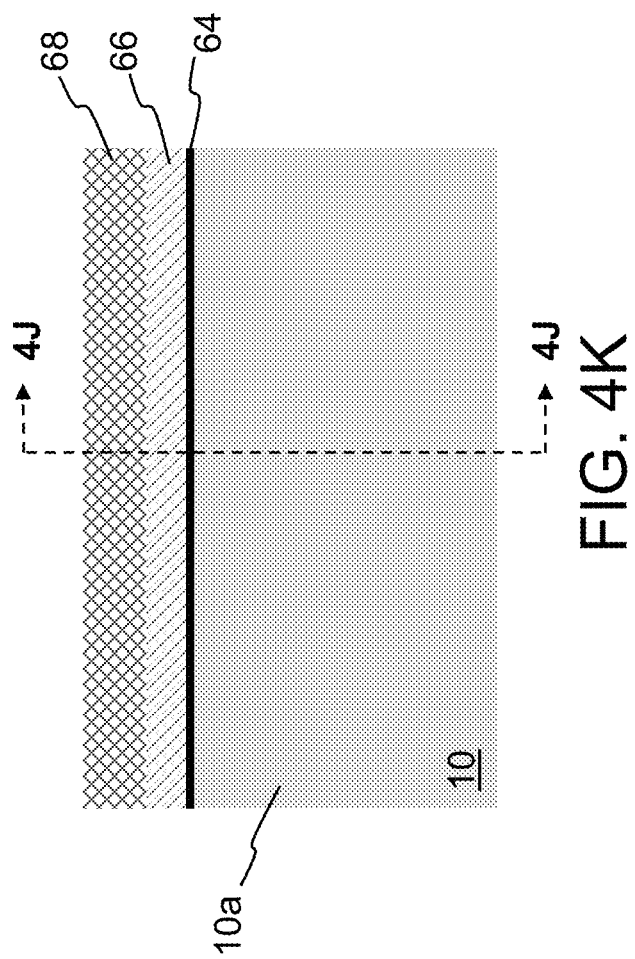

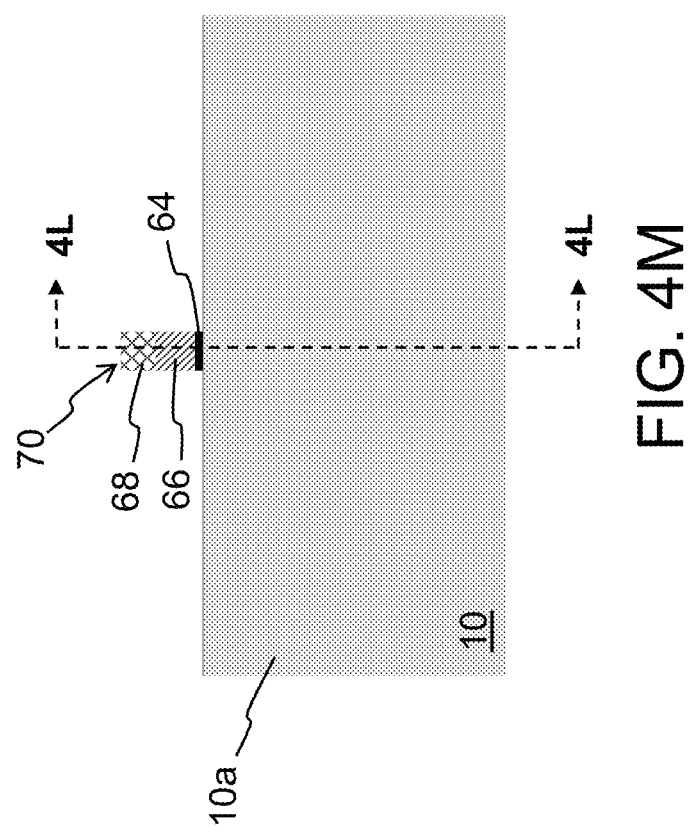

SPLIT GATE NON-VOLATILE FLASH MEMORY CELL HAVING METAL GATES AND METHOD OF MAKING SAME

RELATED APPLICATIONS

This application claims the benefit of U.S. Provisional Application No. 62/250,349, filed Nov. 3, 2015, and which is incorporated herein by reference.

TECHNICAL FIELD

The present invention relates to a non-volatile flash memory cell which has a select gate, a floating gate, a control gate, and an erase gate.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375. It is also known to form logic devices (i.e., low voltage and/or high voltage logic devices) on the same silicon chip, and in doing so sharing some of the processing steps for forming portions of both the memory and logic devices (e.g. forming gates for both memory cells and logic devices using the same polysilicon deposition process). However, other processing steps in forming the memory cells can adversely affect the previously fabricated logic devices, and vice versa, so it often can be difficult and complex to form both types of devices on the same wafer.

To solve problems with reduced channel widths by shrinking lithography size, Fin-FET types of structures have been proposed for memory cell structures. In a Fin-FET type of structure, a fin shaped member of semiconductor material connects the source to the drain regions. The fin shaped member has a top surface and two side surfaces. Current from the source to the drain regions can then flow along the top surface as well as the two side surfaces of the fin shaped member. Thus, the effective width of the channel region is increased, thereby increasing the current flow. However, the effective width of the channel region is increased without sacrificing more semiconductor real estate by "folding" the channel region into two side surfaces, thereby reducing the "footprint" of the channel region. Non-volatile memory cells using such Fin-FETs have been disclosed. Some examples of prior art Fin-FET non-volatile memory structures include U.S. Pat. Nos. 7,423,310, 7,410,913 and 8,461,640. What these prior art references do not contemplate is a Fin-FET type configuration for logic devices formed on the same wafer substrate as non-volatile memory cells of a non-Fin-FET type configuration.

BRIEF SUMMARY OF THE INVENTION

The aforementioned problems and needs are addressed by a memory device, including a silicon substrate, a logic device formed in a logic device area of the substrate, and a memory cell formed in a memory cell area of the substrate. The substrate has an upper surface that is planar in the memory cell area of the silicon substrate, and includes an upwardly extending silicon fin in the logic device area of the silicon substrate. The silicon fin includes a pair of side surfaces extending up and terminating at a top surface. The logic device includes spaced apart first source and first drain regions formed in the silicon substrate with a first channel region of the silicon substrate extending there between wherein the first channel region extends along the top surface and the pair of side surfaces, and a conductive logic gate disposed over and insulated from the top surface and disposed laterally adjacent to and insulated from the pair of side surfaces. The memory cell includes spaced apart second source and second drain regions formed in the silicon substrate with a second channel region of the silicon substrate extending there between, a conductive floating gate disposed over and insulated from a first portion of the second channel region that is adjacent the second source region, a conductive word line gate disposed over and insulated from a second portion of the second channel region that is adjacent the second drain region, a conductive control gate disposed over and insulated from the floating gate, and a conductive erase gate disposed over and insulated from the second source region.

A method of forming a memory device includes forming spaced apart first source and first drain regions in a memory cell area of a silicon substrate with a first channel region of the silicon substrate extending there between, forming a conductive floating gate disposed over and insulated from a first portion of the first channel region that is adjacent the first source region, forming a conductive word line gate disposed over and insulated from a second portion of the first channel region that is adjacent the first drain region, forming a conductive control gate disposed over and insulated from the floating gate, forming a conductive erase gate disposed over and insulated from the first source region, forming a protective layer of material over the floating gate, the control gate, the erase gate and the word line gate, forming an upwardly extending silicon fin in a logic device area of the silicon substrate by removing portions of the silicon substrate in the logic device area (wherein the silicon fin includes a pair of side surfaces extending up and terminating at a top surface, and the forming of the upwardly extending silicon fin is performed after the forming of the floating gate, the control gate, the source region, the erase gate, the word line gate and the protective layer), forming a conductive logic gate disposed over and insulated from the top surface and disposed laterally adjacent to and insulated from the pair of side surfaces, and forming spaced apart second source and second drain regions in the logic device area of silicon substrate with a second channel region of the silicon substrate extending there between, wherein the second channel region extends along the top surface and the pair of side surfaces.

Other objects and features of the present invention will become apparent by a review of the specification, claims and appended figures.

BRIEF DESCRIPTION OF THE DRAWINGS

FIGS. 1A-1I are side cross sectional views showing the steps in forming non-volatile memory cells in a memory cell area of a semiconductor substrate.

FIGS. 3A-3J are side cross sectional views showing the steps in forming non-volatile memory cells in a memory cell area of a semiconductor substrate.

DETAILED DESCRIPTION OF THE INVENTION

Figure 1A:
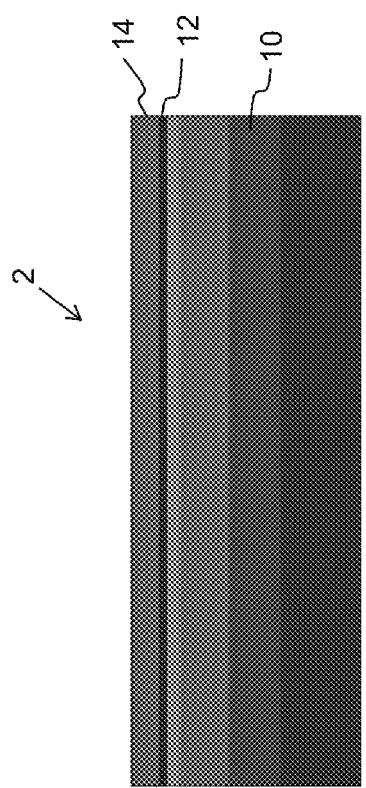

Referring to FIGS. 1A-1I there are shown cross-sectional views of the steps in the process of making pairs of memory cells in a memory cell area 2 of a silicon wafer substrate. The process begins by forming a layer of silicon dioxide (oxide) 12 on a substrate 10 of (e.g. P type single crystalline silicon). Thereafter a first layer 14 of polysilicon (or amorphous silicon) is formed on the layer 12 of silicon dioxide, as illustrated in FIG. 1A. The first layer 14 of polysilicon is subsequently patterned in a direction perpendicular to the view of FIG. 1A using a masking photolithography process.

Figure 1B:
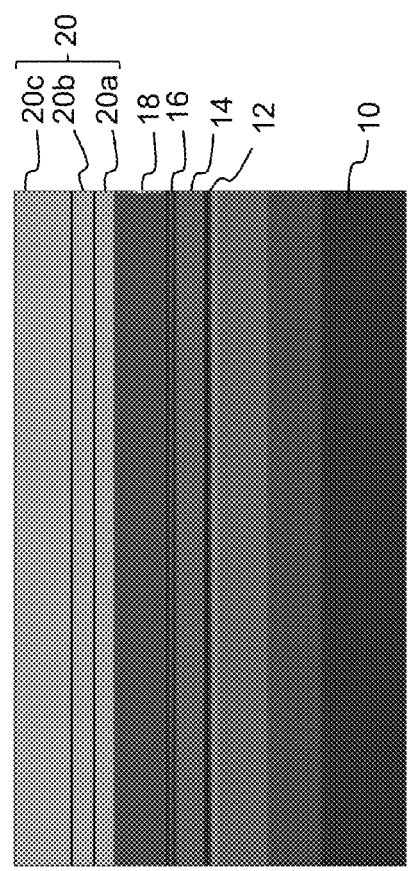

Another insulating layer 16, such as silicon dioxide (or even a composite layer, such as ONO (oxide, nitride, oxide)) is formed on the first layer 14 of polysilicon. A second layer 18 of polysilicon is then formed on the oxide layer 16. Another insulating layer 20 is formed on the second layer 18 of polysilicon and used as a hard mask during subsequent dry etching. In the preferred embodiment, the layer 20 is a composite layer, comprising silicon nitride 20a, silicon dioxide 20b, and silicon nitride 20c. The resulting structure is shown in FIG. 1B. The hard mask 20 may instead be a composite layer of silicon oxide 20b and silicon nitride 20c. The hard mask 20 may also instead be formed with a thick silicon nitride layer 20a only.

Photoresist material (not shown) is coated on the structure, and a masking step is performed exposing selected portions of the photoresist material. The photoresist is developed and using the photoresist as a mask, the structure is etched. Specifically, the composite layer 20, the second layer 18 of polysilicon, and the insulating layer 16 are anisotropically etched, until the first layer 14 of polysilicon is exposed. The resultant memory cell stack structures is shown in FIG. 1C. Although only two "stacks" (S1 and S2) are shown, it should be clear that there are a number of such pairs of "stacks" that are separated from one another.

Silicon dioxide 22 is formed on the structure. This is followed by the formation of silicon nitride layer 24. The silicon nitride 24 is anisotropically etched leaving a composite spacer 26 (which is the combination of the silicon dioxide 22 and silicon nitride 24) alongside each of the stacks S1 and S2. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). The resultant structure is shown in FIG. 1D.

Figure 1E:
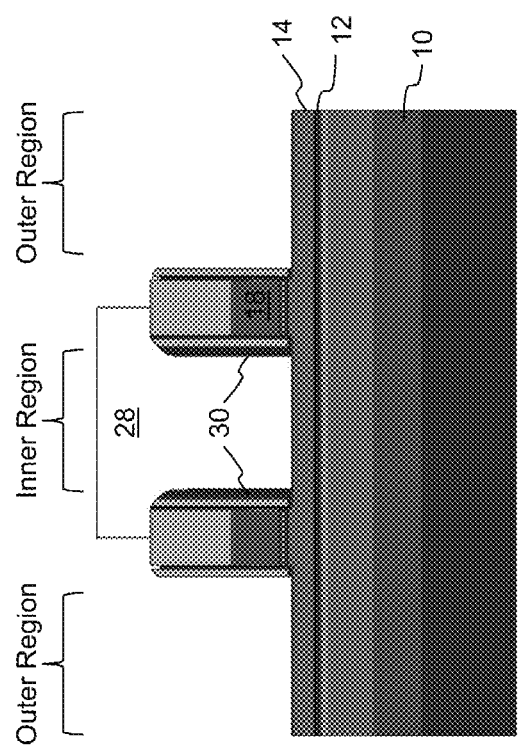

A layer of oxide is formed over the structure, followed by an anisotropical etch leaving spacers 30 of the oxide alongside the stacks S1 and S2. A photoresist 28 is formed over the regions between the stacks S1 and S2, and other alternating pairs of stacks S1 and S2. As used herein, the region between the pair of stacks S1 and S2 is referred to as the "inner region" and the regions outside of the inner region (i.e. between adjacent pairs of stacks S1 and S2) are referred to as the "outer regions." The exposed spacers 30 in the outer regions are removed by isotropic etch. The resulting structure is shown in FIG. 1E.

Figure 1F:
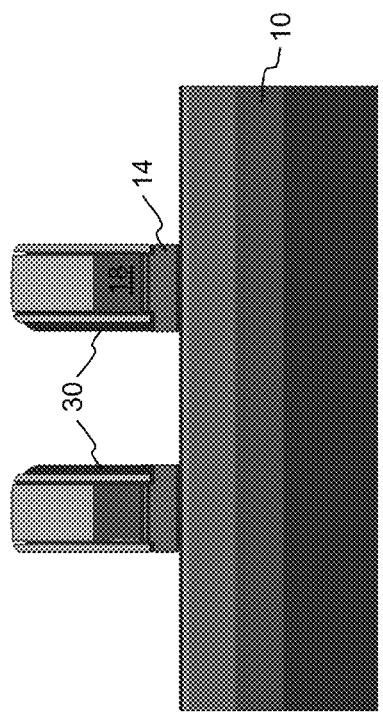

After the photoresist 28 is removed, the exposed portions first polysilicon 14 in the inner and outer regions are anisotropically etched, leaving a block of polysilicon 14 in each stack S1/S2. Part of oxide layer 12 will also be etched (removed) during the poly over-etching. A thinner layer of remaining oxide will preferably stay on the substrate 10 so as to prevent damage to the substrate 10. The resultant structure is shown in FIG. 1F.

Figure 1G:
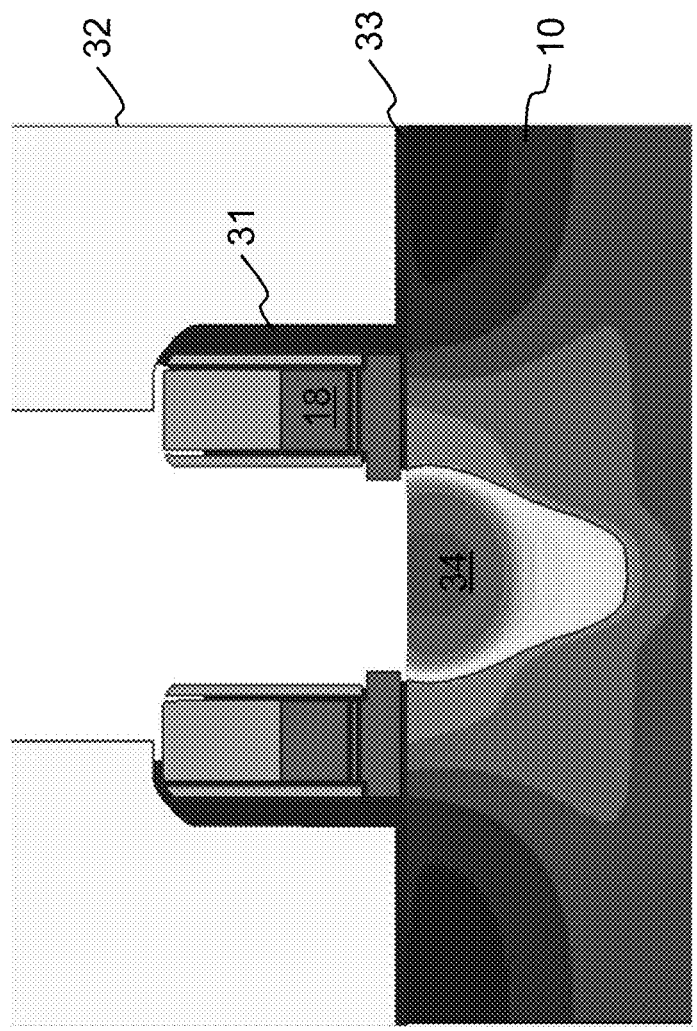

A layer of oxide is formed over the structure, followed by an anisotropical etch leaving spacers 31 of the oxide alongside the stacks S1 and S2 and a layer 33 of oxide on substrate 10. Another oxide layer is formed over the structure, thickening spacers 31 and layer 33. Photoresist material 32 is then coated and masked leaving openings in the inner regions between the stacks S1 and S2. The resultant structure is subject to an ion implant (i.e. into exposed portions of substrate 10 in the inner region) to form source region 34 in the substrate. The oxide spacers 31 adjacent to the stacks S1 and S2 and oxide layer 33 in the inner region are then removed by e.g. a wet etch. The resultant structure is shown in FIG. 1G.

The photoresist material 32 in the outer regions of the stacks S1 and S2 is removed. A high-temperature thermal annealing step is applied to activate the ion implant to complete the formation of source region 34. Silicon dioxide 36 is then formed everywhere. The structure is once again covered by photoresist material 38 and a masking step is performed exposing the outer regions of the stacks S1 and S2 and leaving photoresist material 38 covering the inner region between the stacks S1 and S2. An oxide anisotropical etch followed by isotropic wet etch are performed, to remove oxide 36 and oxide 33 from the outer regions of stacks S1 and S2, and possibly to reduce the thickness of the oxide spacers 31 in the outer regions of the stacks S1 and S2. The resultant structure is shown in FIG. 1H. Optionally, the source region 34 portion of the substrate can be oxidized to thicken the oxide on the substrate that is over the source region 34.

An insulation layer 40 is formed over the structure. Preferably, the insulation layer 40 includes a first layer of thin oxide as the interfacial layer (IL) and a second layer of a high K material (i.e. having a dielectric constant K greater than that of oxide, such as $HfO_2$, $ZrO_2$, $TiO_2$, $Ta_2O_5$, or other adequate materials, etc.). The IL thickness may be varied to achieve different threshold voltage for the select gate of the split-gate flash cell. An optional thermal treatment may follow to enhance moisture control on the gate dielectric. A capping layer, such as TiN, TaN, TiSiN, may be included in the insulation layer 40 (on the high K material to protect it from damage in the subsequent processing steps). After photo resist 38 is removed, polysilicon is then deposited over the structure, followed by a CMP etch, resulting in a block 42a of the polysilicon layer in the inner region of the stacks S1 and S2, and blocks 42b of the polysilicon in the outer regions of the stacks S1 and S2. The resultant structure is shown in FIG. 1I, where for each memory cell, poly block 42a constitutes the erase gate, poly block 42b constitutes the word line gate, oxide 20 serves as a hard mask HM, poly block 18 constitutes the control gate, and poly block 14 constitutes the floating gate.

Figure 2:
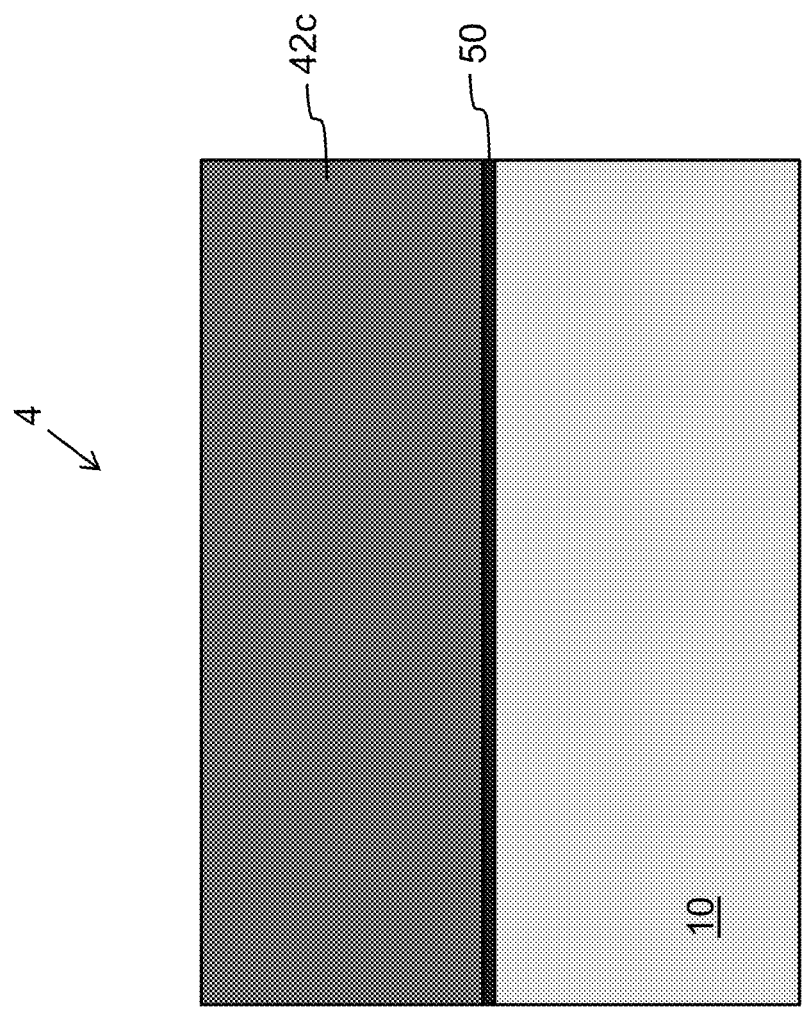
FIG. 2 is a side cross sectional view of the logic device area of the semiconductor substrate at the beginning of the logic device formation.

The poly deposition and CMP etch for forming the erase and word line gates 42a/42b in the memory area also forms block 42c of the polysilicon on oxide 50 in the logic device area 4 of the wafer (including core logic and non-core logic areas), as shown in FIG. 2.

Figure 3A:
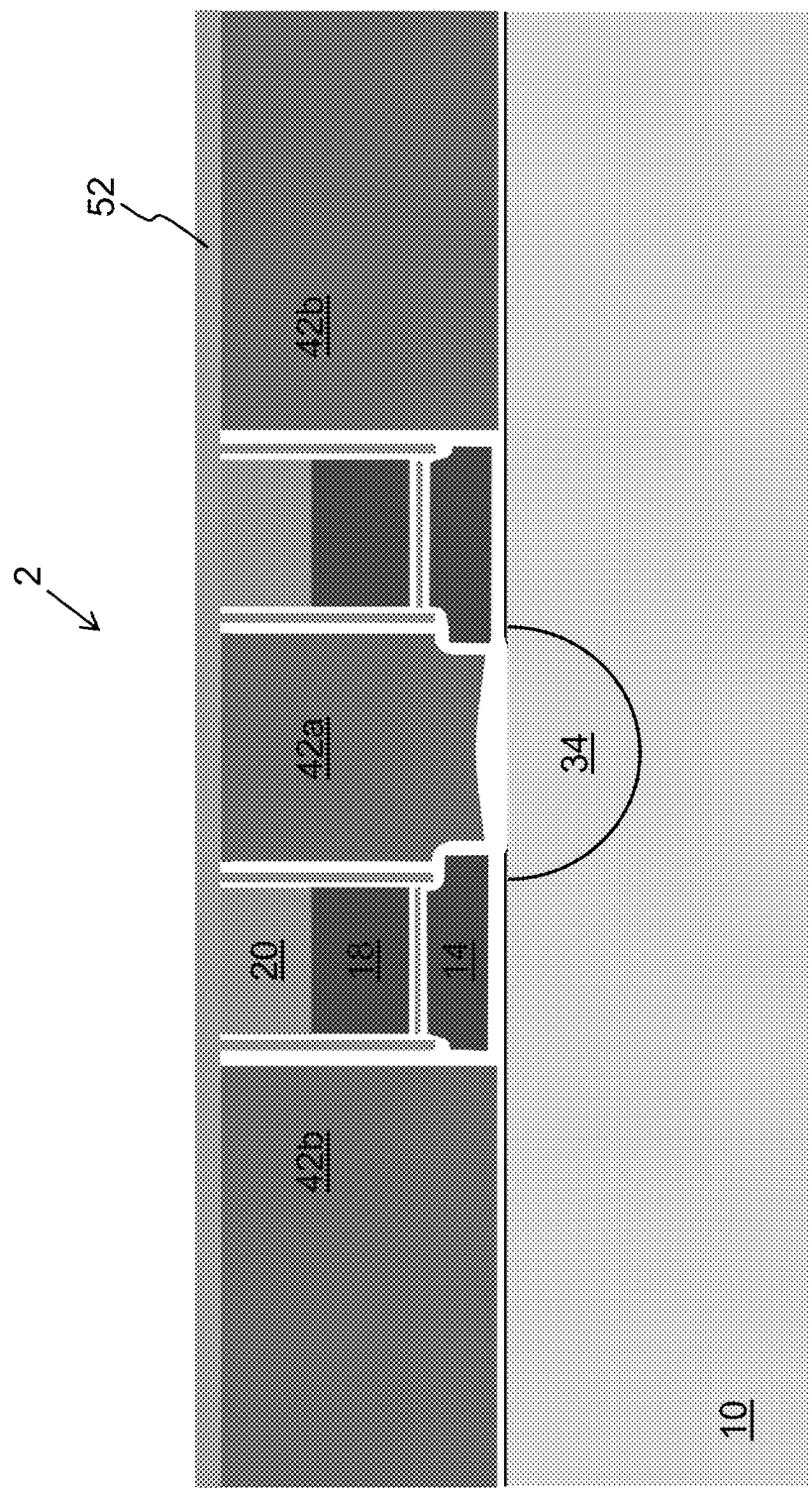
Figure 3B:
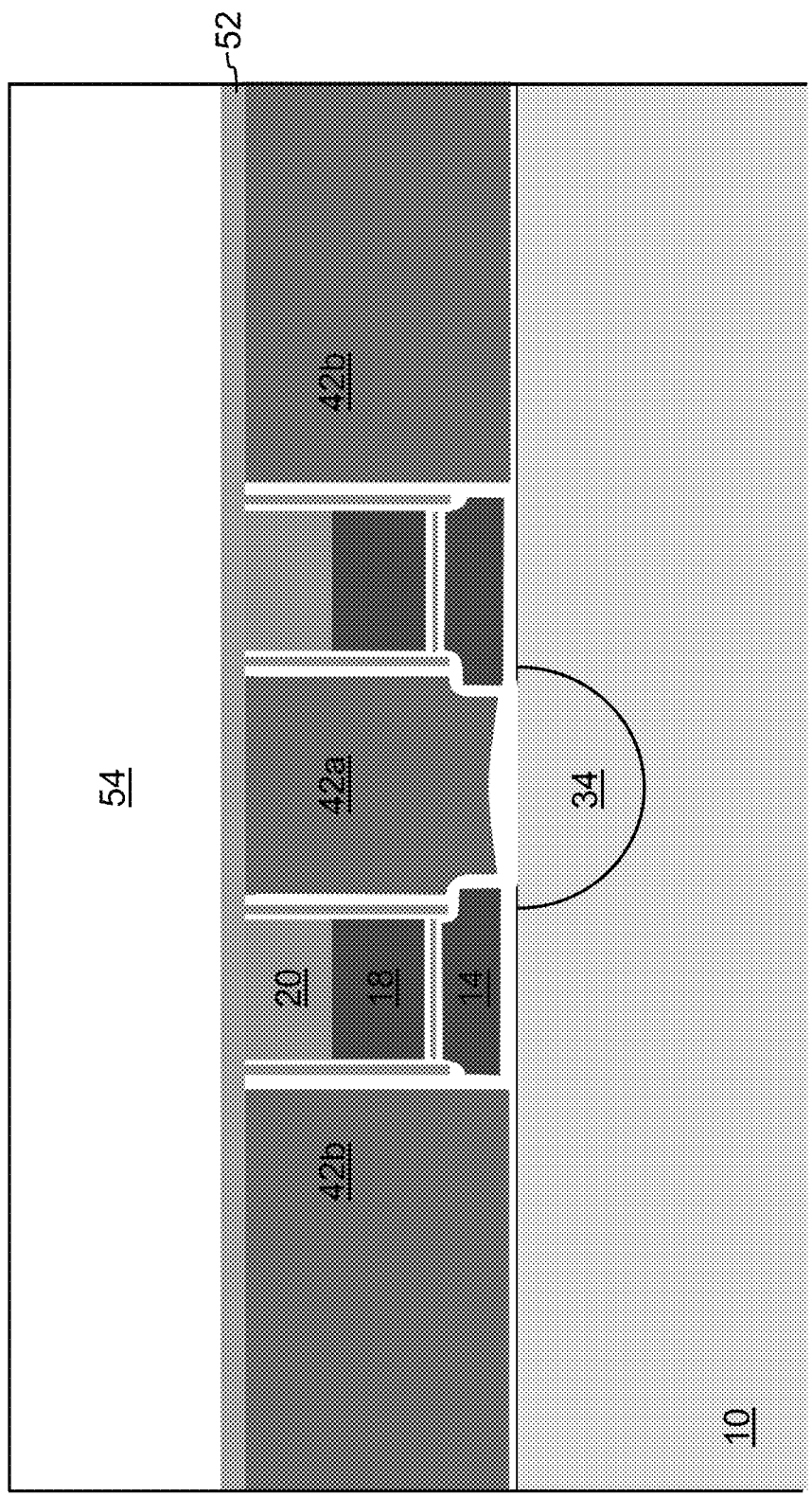
Figure 3C:
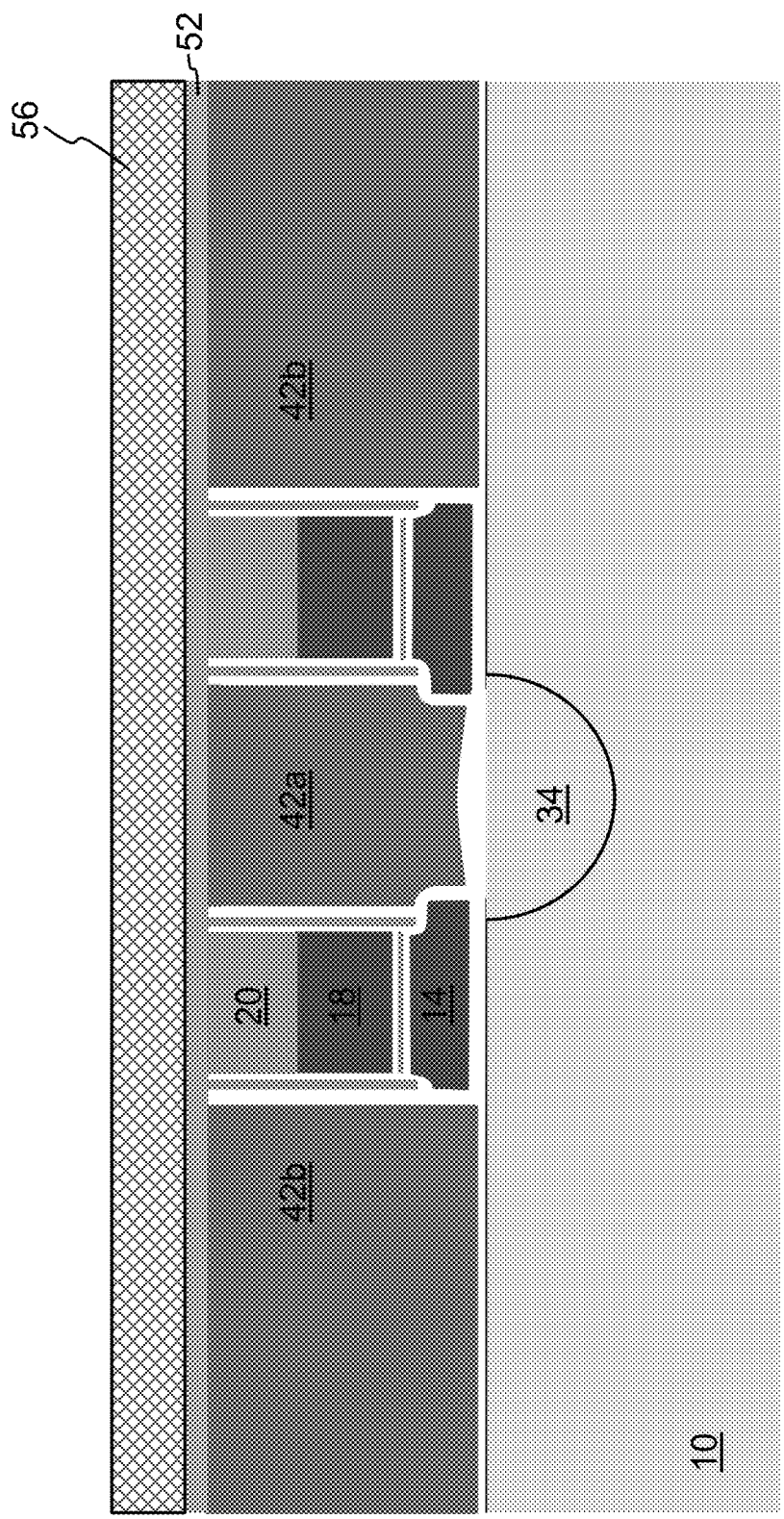
Figure 3D:
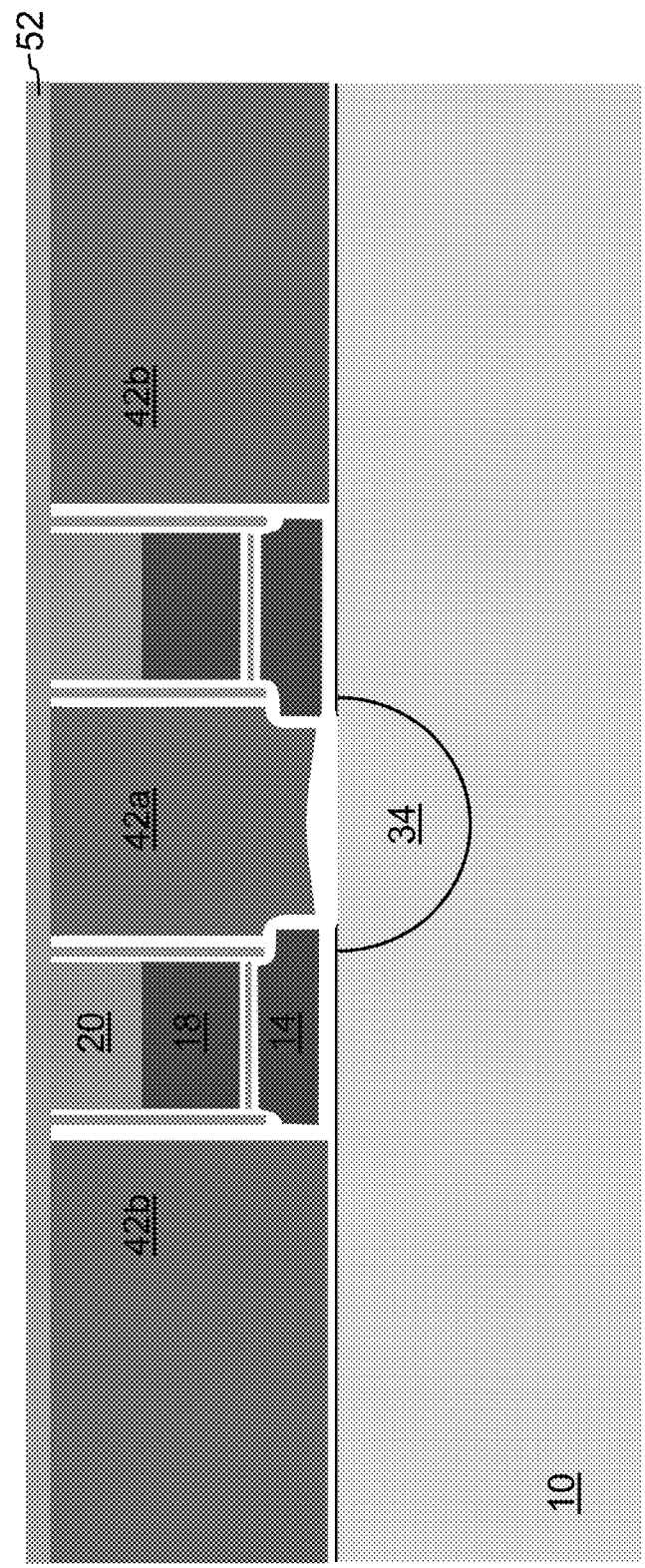
Figure 3E:
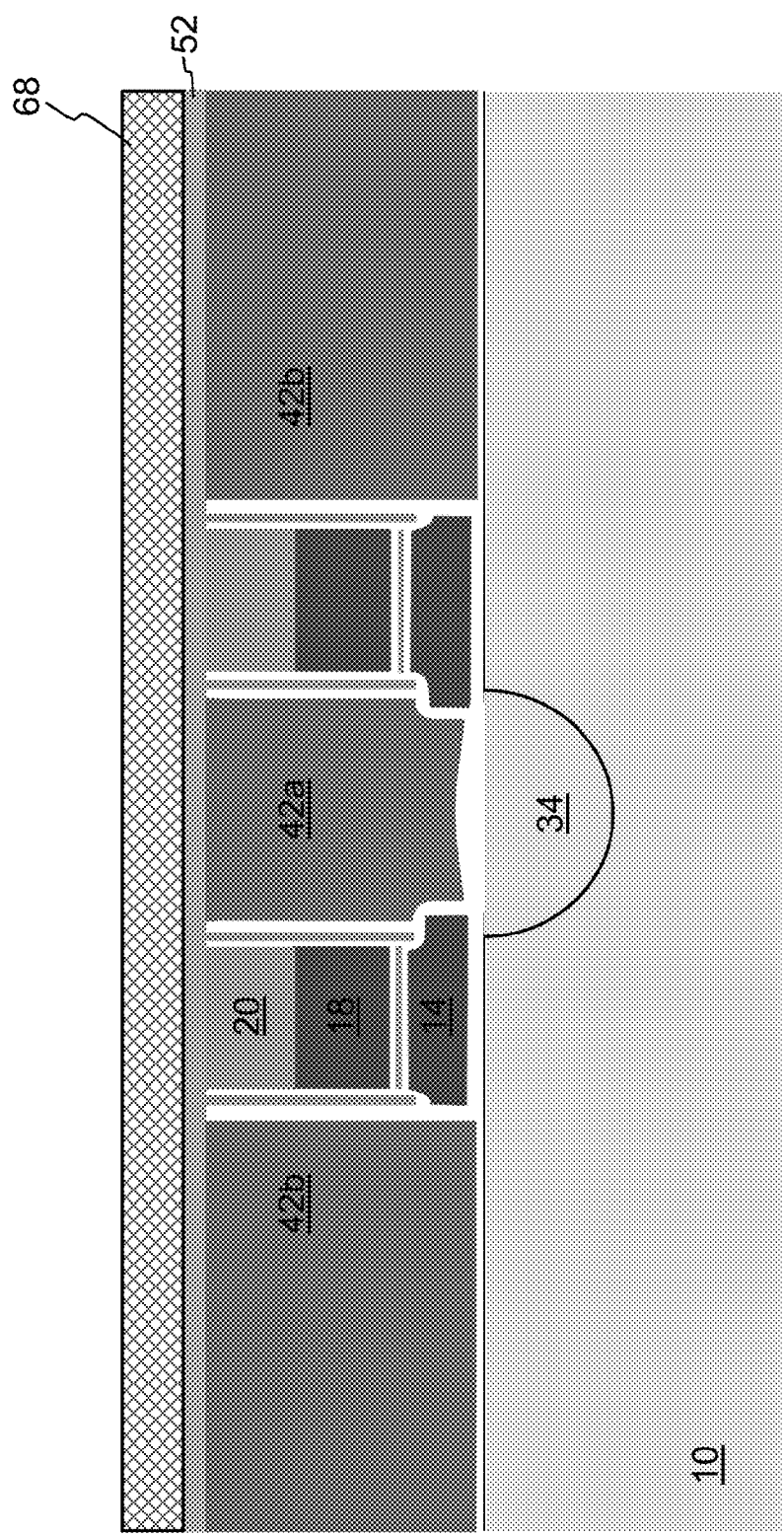
Figure 3F:
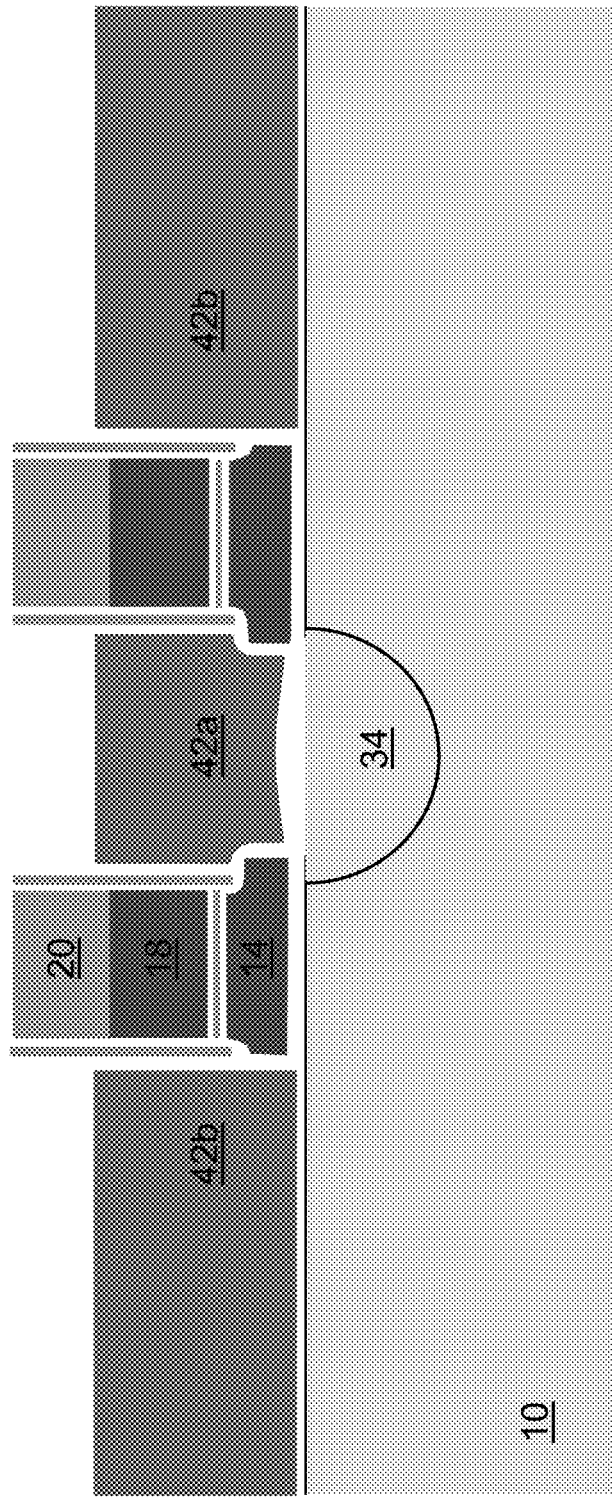
Figure 3H:
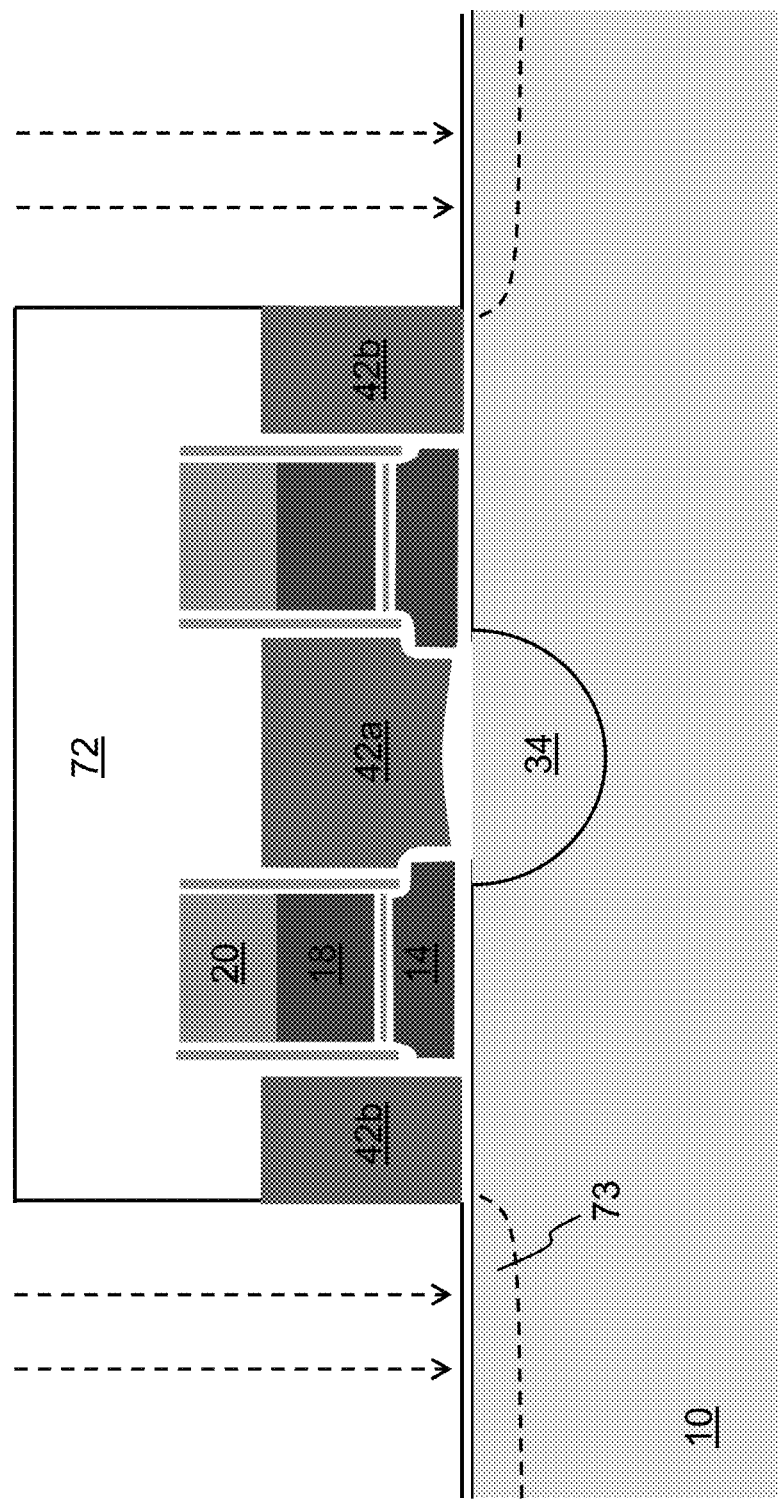
Figure 3I:
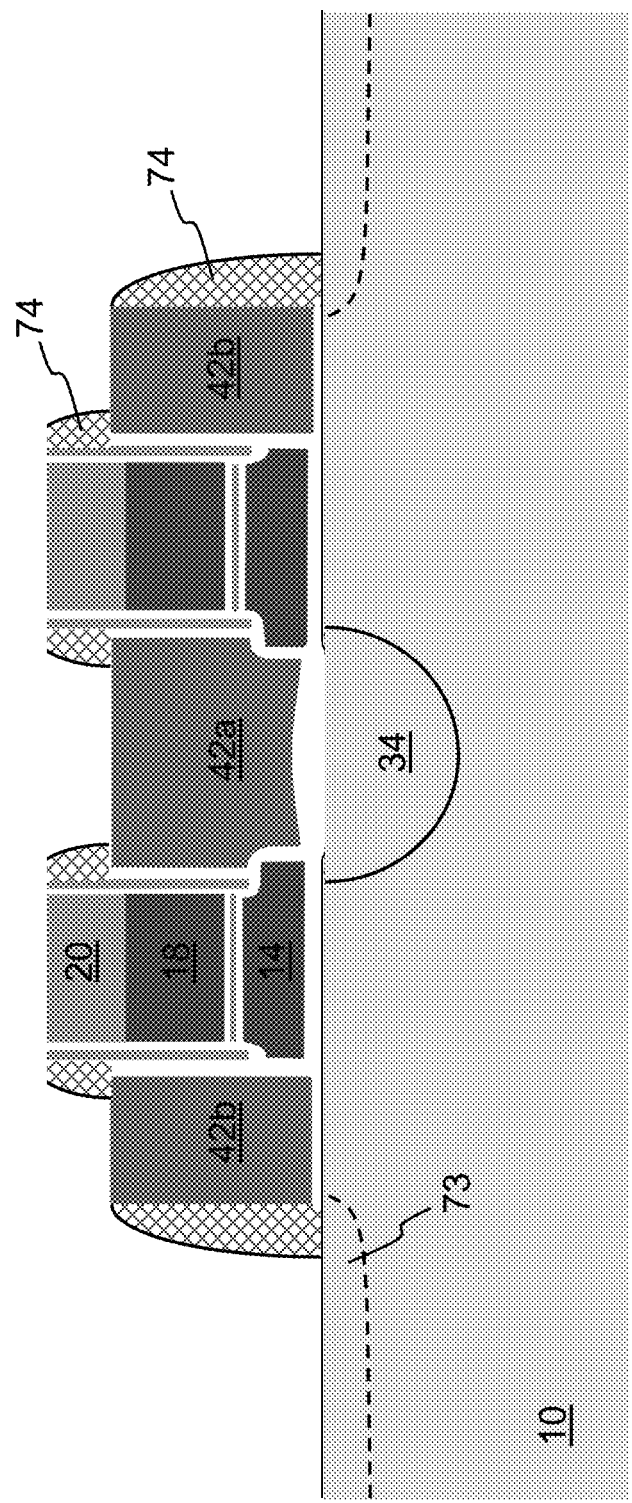
Figure 3J:
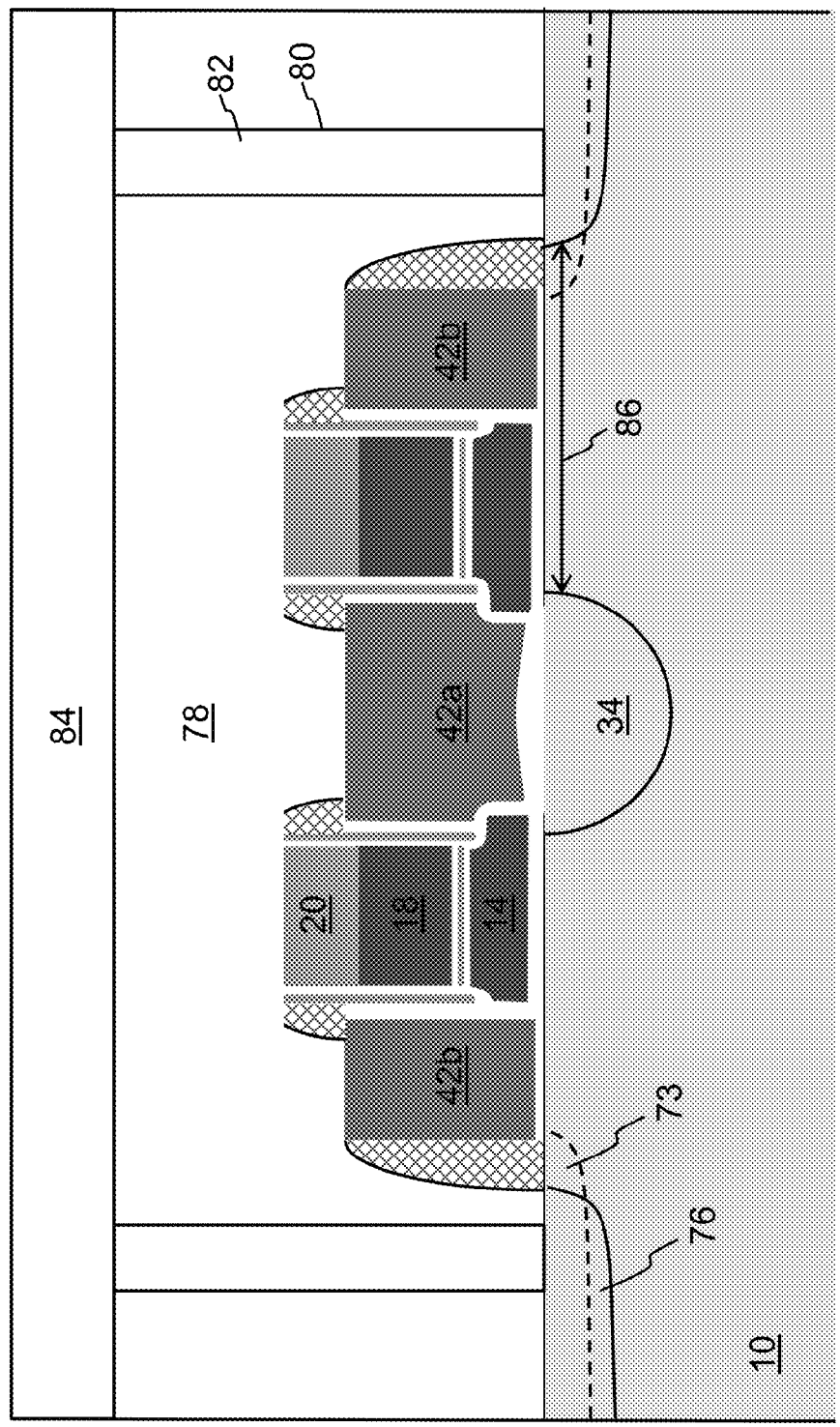
Figure 4A:
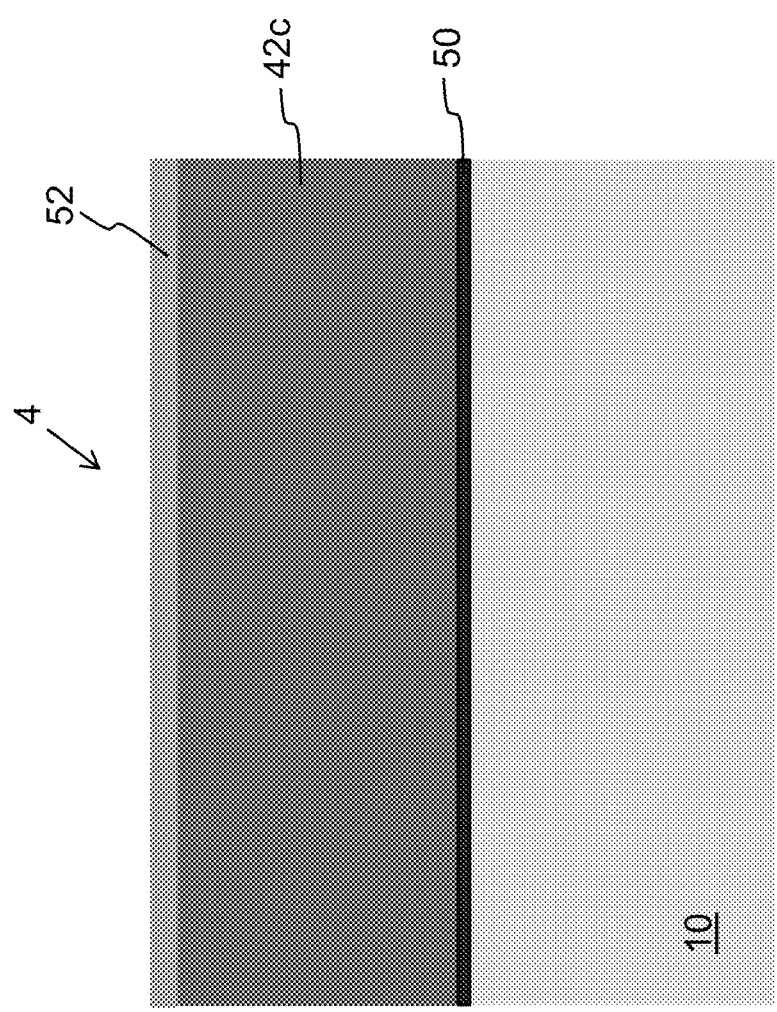
FIGS. 4A-4N are side cross sectional views showing the steps in forming logic devices in the logic device area of the semiconductor substrate.
Figure 4B:
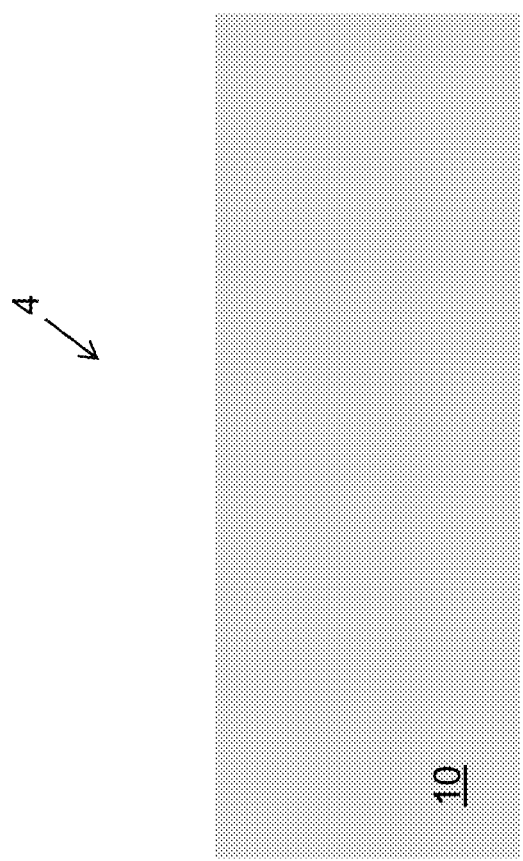
Figure 4C:
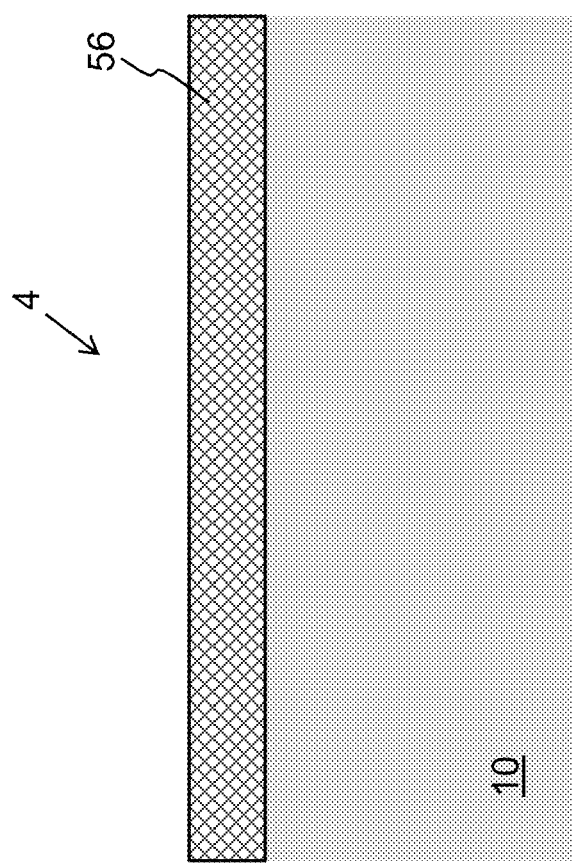
Figure 4E:
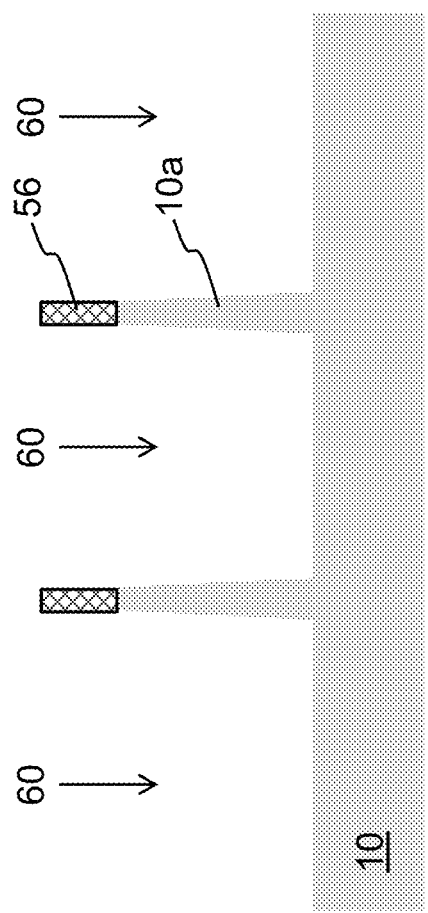
Figure 4F:
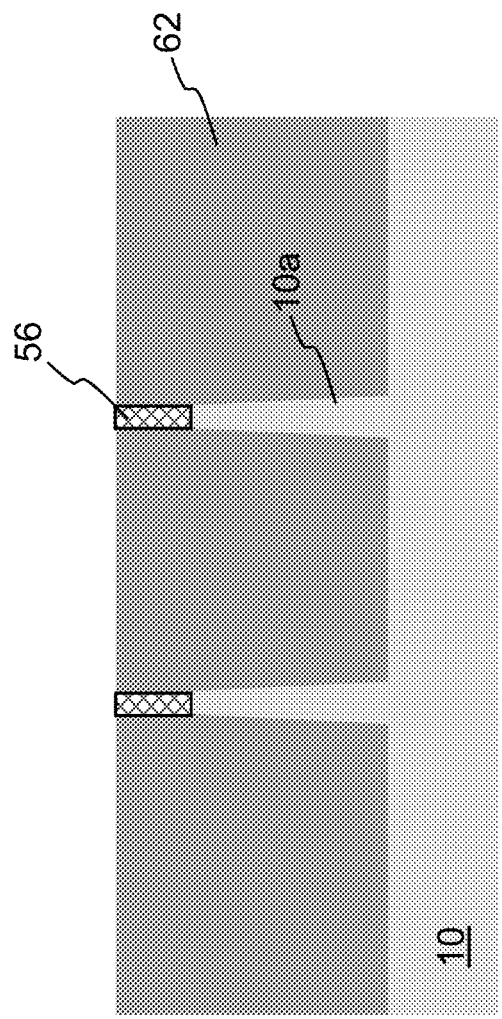
Figure 4G:
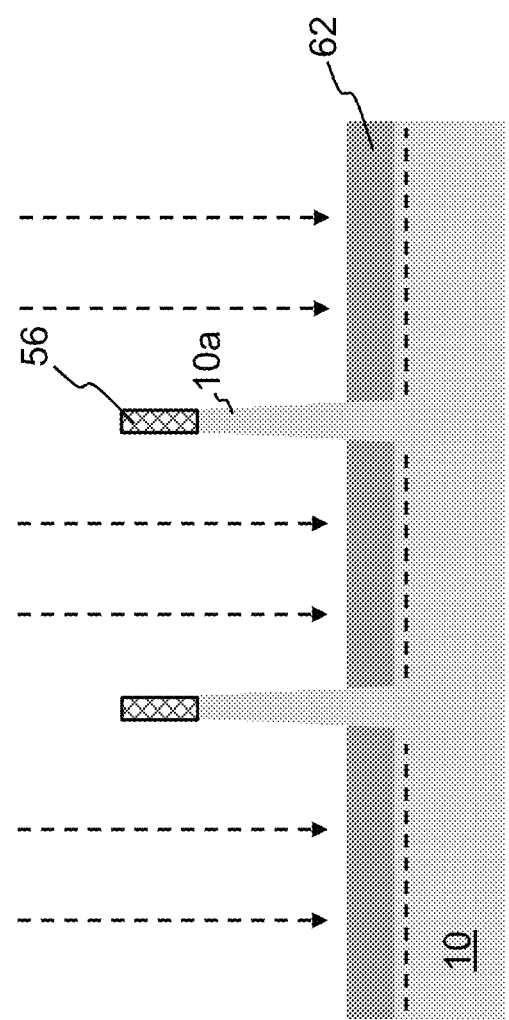
Figure 4H:
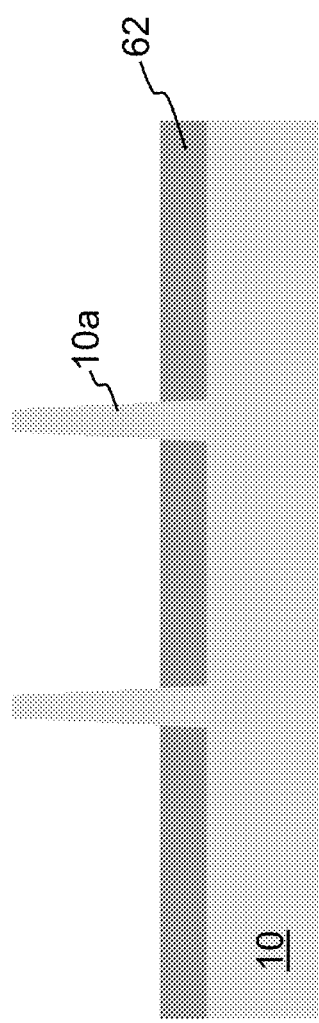
Figure 4I:
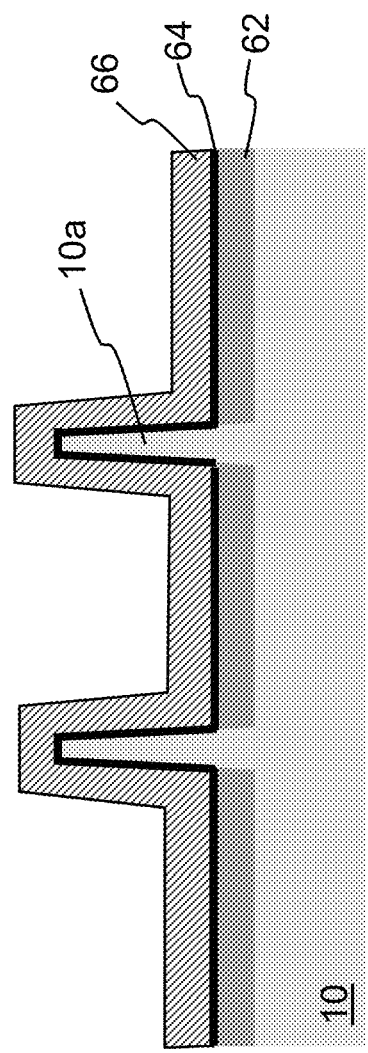
Figure 4L:
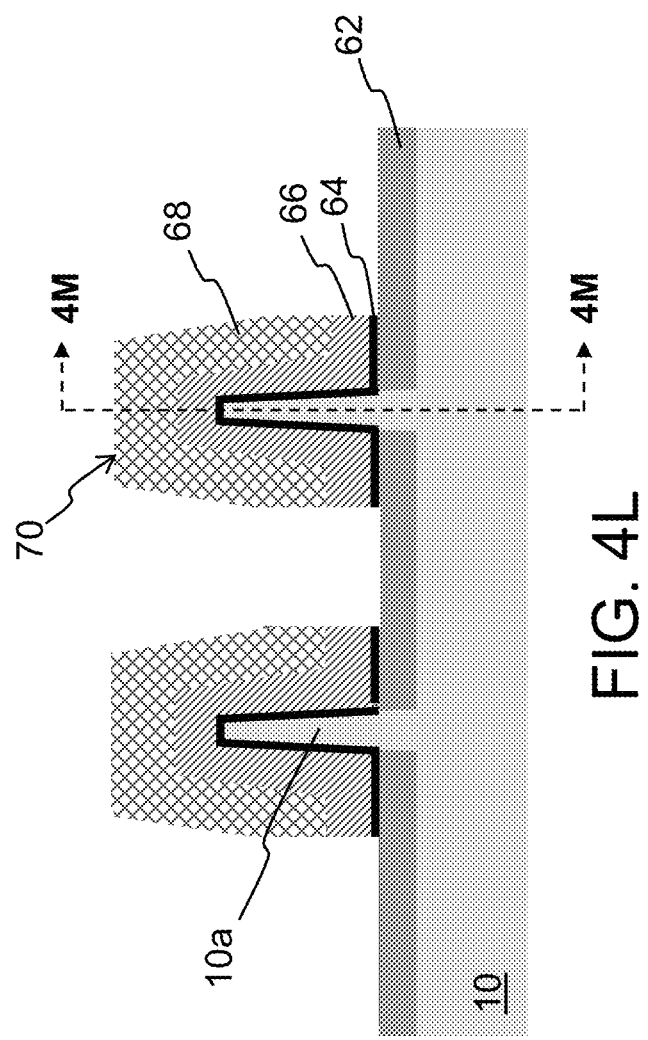
Figure 4N:
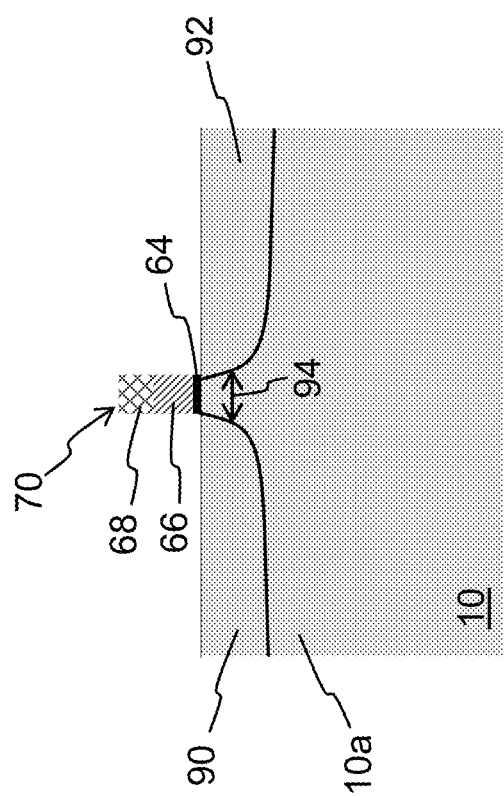

FIGS. 3A-3J show the continued processing of the memory cells in the memory cell area 2 of wafer, while FIGS. 4A-4N show the processing in the logic device area 4 of the wafer (in forming the logic devices). As shown in FIGS. 3A and 4A, an oxide layer 52 is formed over the structures in the memory cell area 2 and the logic device area 4. This oxide layer will protect the memory cell area 2 from the subsequent logic device area processing. Photoresist 54 is formed over the memory cell area 2, while leaving the logic device area 4 exposed. Oxide and poly etches are then performed to remove the oxide 52/50 and poly 42c layers in the logic device area 4, leaving just the bare substrate 10, as shown in FIGS. 3B and 4B. The poly etch can be isotropic, and the oxide etch can be wet (such as DHF or BOE). After removal of photo resist 54, a nitride layer 56 is deposited in both memory and logic device areas 2 and 4, as shown in FIGS. 3C and 4C.

Silicon fin formation is then performed in the logic device area 4 starting with forming and patterning photoresist 58 to define thin fin portions of the photoresist in the logic device area 4. The exposed portions of the underlying nitride 56 are then removed by a nitride etch, leaving thin fins of the nitride 56 as shown in FIG. 4D. While the fin pattern in the nitride layer 56 is preferably formed by photo-lithography as shown, it could alternately be formed by other techniques such as self-aligned double patterning (SADP) or sidewall image transfer (SIT). After the photoresist 58 is removed, a silicon etch is performed to form trenches 60 into the exposed portions of substrate 10, as shown in FIG. 4E (where the nitride 56 is used as a hard mask), leaving thin fins of silicon 10a extended up from the now recessed surface of the silicon substrate 10 and separated from each other by the newly formed trenches 60 into the silicon substrate 10. The silicon etch could be wet or dry, and could be TMAH (tetramethylammonium hydroxide).

STI oxide deposition (e.g. TEOS) and CMP etch using the nitride 56 as a CMP etch stop forms STI insulation 62 filling the trenches 60 between adjacent silicon fin portions 10a and nitride blocks 56, as shown in FIG. 4F. An oxide etch (wet or dry) is then used to recess the STI oxide 62 down to near the bottoms of the trenches 60 between the silicon fins 10a. An anti-punch-through implant is then performed through the oxide 62 and into the substrate 10 between the adjacent fin structures 10a, as shown in FIG. 4G. The implant forms punch-through stopper between adjacent fin structures 10a and the border between core and non-core logic areas.

A nitride etch (e.g. hot phosphoric acid) is then used to remove the nitride 56 from the memory area 2 and the logic device area 4, as shown in FIGS. 3D and 4H. A high K material layer 64 is then deposited (e.g. by atomic layer deposition—ALD or Metalorganic Chemical Vapour Deposition—MOCVD) on the structures, followed by the deposition of a layer of metal material 66, as shown in FIG. 4I. A CMP etch is performed which removes the high K and metal layers 64 and 66 from the memory cell area 2. A nitride layer 68 (which will serve as a hard mask) is then deposited over the structures, as shown in FIGS. 3E, 4J and 4K (FIG. 4K is an orthogonal view of the logic device area 4 relative to FIG. 4J). A layer of amorphous silicon also may be used as a hard mask. A thin layer of DARC (Dielectric Anti-Reflective Coating) is then deposited (as an ARC layer for photo-lithography). A masking step is used to define with photoresist the gate areas in the logic device area. Etching is used to remove the exposed portions of the nitride 68, metal 66 and high K layer 64 in the logic device area 4, as shown in FIGS. 4L and 4M (after photoresist removal). This etch define the logic gates 70 which are conductive and covered with insulation, and which extend along the top and side surfaces of the silicon fin structures 10a.

The processing of the memory cell area 2 continues with a masking step (to cover the logic device area 4 with photoresist, while leaving the memory area 2 exposed), followed by nitride and oxide etches to remove the nitride and oxide layers 68 and 52, and a poly etch to recess the erase gate poly 42a and word line gate poly 42b, as shown in FIG. 3F. A masking step is used to cover the pairs of memory cell stacks with photoresist 72 and define the outer edges of the word line gate poly 42b, followed by a poly anisotropic etch, resulting in the structure in FIG. 3G. An LDD implant into the exposed substrate portions is performed to form LDD regions 73 which allow the BL (N+) junctions to underlap the word line gate 42b with LDD (N−) junction, as shown in FIG. 3H.

After photo resist removal, a nitride deposition and etch is performed to form nitride spacers 74 along the word line poly gates 42b and along the hard mask 20 (while lowering the upper surface of hard mask 20), as shown in FIG. 3I. An N+ implant and thermal activation are performed to form N+ junctions (drain regions) 76 adjacent the nitride spacers 74. This same or different implant can be performed to form source and drain regions 90 and 92 in the logic device area 4. The structure is covered with insulation (ILD) 78, into which contact holes 80 are formed by masking and etch processes. Metal is then deposited to form metal contacts 82 that extend through the ILD 78 to the drain regions 76, and are tied together by a metal bit line 84. Metal contacts are also formed in the SL, EG, and WL strapping regions to connect them to external circuits for electrical operations (such as program, erase and read). Contact formation for the FinFET logic devices is performed differently than for the memory cell area. For example, for n-FinFET devices, in-situ doping of the raised source and drain can be used to form contacts. For p-FinFET, eSiGe of the source and drain to induce compressive stress in channel can be used. A self-aligned contact is formed by recessing the metal gate, adding capping layers such as nitride and oxide, followed by CMP planarization and contact patterning. The final resulting structures are shown in FIGS. 3J and 4N.

As illustrated in FIG. 3J, source and drain regions 34 and 76 define a channel region 86 in the substrate there between. The floating gate 14 is disposed over and controls a first portion of the channel region 86, and the word line gate 42b is disposed over and controls a second portion of the channel region 86. The control gate 18 is disposed over the floating gate 14, and the erase gate 42a is disposed over the source region 34. As illustrated in FIG. 4N in the logic area, source and drain regions 90 and 92 define a channel region 94 there between, where the channel region 94 includes a top surface portion extending along the top of the fin structure 10a, and side surface portions extending along the sides of the fin structure 10a. The logic gate 70 is disposed over the top surface portion of the channel region 94, and laterally adjacent to the side surface portions of the channel region 94.

The above described memory device method and structure provide the advantages (high operational performance, ease of manufacturing) of planar memory cells (i.e. memory cells that are formed on a planar region of the substrate) with the advantages (advanced combination of embedded logic and memory devices) of non-planar logic devices (i.e., logic devices that are formed around silicon fin structures).

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order (unless there is an explicitly recited limitation on any order) that allows the proper formation of the memory cells and logic devices of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a memory device, comprising:
   forming spaced apart first source and first drain regions in a memory cell area of a silicon substrate, with a first channel region of the silicon substrate extending there between;
   forming a conductive floating gate disposed over and insulated from a first portion of the first channel region that is adjacent the first source region;
   forming a conductive word line gate disposed over and insulated from a second portion of the first channel region that is adjacent the first drain region;
   forming a conductive control gate disposed over and insulated from the floating gate;
   forming a conductive erase gate disposed over and insulated from the first source region;
   forming a protective layer of material over the floating gate, the control gate, the erase gate and the word line gate;
   forming an upwardly extending silicon fin in a logic device area of the silicon substrate by removing portions of the silicon substrate in the logic device area, wherein:
      the silicon fin includes a pair of side surfaces extending up and terminating at a top surface, and
      the forming of the upwardly extending silicon fin is performed after the forming of the floating gate, the control gate, the source region, the erase gate, the word line gate and the protective layer;
   forming a conductive logic gate disposed over and insulated from the top surface, and disposed laterally adjacent to and insulated from the pair of side surfaces; and
   forming spaced apart second source and second drain regions in the logic device area of silicon substrate with a second channel region of the silicon substrate extending there between, wherein the second channel region extends along the top surface and the pair of side surfaces.

2. The method of claim 1, further comprising:
   removing the protective layer after the forming of the silicon fin and the logic gate.

3. The method of claim 2, wherein the forming of the first source region is performed before the forming of the protective layer, and the forming of the first drain region is performed after the removing of the protective layer.

4. The method of claim 2, further comprising:
   performing an etch to reduce a width of the word line gate after the removing of the protective layer.

5. The method of claim 4, wherein the forming of the first drain region is performed after the performing of the etch.

6. The method of claim 1, wherein the forming of the floating gate and the forming of the control gate comprise:
   forming a first conductive layer over and insulated from the memory cell area of the silicon substrate;
   forming a second conductive layer over and insulated from the first conductive layer in the memory cell area;
   etching the second conductive layer to form a block of the second conductive layer over the first conductive layer; and
   etching the first conductive layer to form a block of the first conductive layer between the substrate and the block of the second conductive layer;
   wherein the block of the second conductive layer is the control gate and the block of the first conductive layer is the floating gate.

7. The method of claim 1, wherein the conductive logic gate is insulated from the top surface and from the pair of side surfaces by a layer of high K material.

8. The method of claim 2, wherein the conductive logic gate is formed of metal.

9. The method of claim 1, wherein the word line gate is insulated from the second portion of the first channel region by a layer of high K material.

10. The method of claim 1, wherein the word line gate is insulated from the second portion of the first channel region by a layer of high K material and a layer of oxide.

* * * * *